(12) United States Patent
Akiyama et al.

(10) Patent No.: US 11,022,811 B2
(45) Date of Patent: Jun. 1, 2021

(54) OPTICAL AMPLIFIER AND OPTICAL SWITCH DEVICE

(71) Applicants: FUJITSU LIMITED, Kawasaki (JP); National Institute of Advanced Industrial Science and Technology, Tokyo (JP)

(72) Inventors: Suguru Akiyama, Tsukuba (JP); Kazuhiro Ikeda, Tsukuba (JP); Takeshi Matsumoto, Ebina (JP); Hitoshi Kawashima, Tsukuba (JP); Keijiro Suzuki, Tsukuba (JP); Ken Tanizawa, Tsukuba (JP)

(73) Assignees: FUJITSU LIMITED, Kawasaki (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 486 days.

(21) Appl. No.: 16/055,616

(22) Filed: Aug. 6, 2018

(65) Prior Publication Data
US 2019/0049743 A1    Feb. 14, 2019

(30) Foreign Application Priority Data

Aug. 8, 2017  (JP) .............................. JP2017-153630

(51) Int. Cl.
*G02B 27/28* (2006.01)
*G02B 6/27* (2006.01)
(Continued)

(52) U.S. Cl.
CPC ......... *G02B 27/283* (2013.01); *G02B 6/2773* (2013.01); *H01S 5/005* (2013.01);
(Continued)

(58) Field of Classification Search
CPC .... H01S 5/005; H01S 5/5018; H04B 10/6162
See application file for complete search history.

(56) References Cited

U.S. PATENT DOCUMENTS 6,760,151 B1 * 7/2004 Vail .......................... H01S 3/005
359/334
7,002,733 B2 * 2/2006 Dagenais ........... H04B 10/2914
359/337
(Continued)

FOREIGN PATENT DOCUMENTS

JP    2001-007450 A    1/2001
JP    2013-058628 A    3/2013

*Primary Examiner* — Eric L Bolda
(74) *Attorney, Agent, or Firm* — Kratz, Quintos & Hanson. LLP

(57) ABSTRACT

An optical amplifier includes a polarization splitter, a polarization rotator, first and second optical couplers, and first and second semiconductor optical amplifying devices. The TE polarized wave of light split by the polarization splitter is input to a first input port of the first optical coupler. The TM polarized wave of the split light is converted into a TE polarized wave by the polarization rotator to be input to a second input port of the first optical coupler. First light and second light output from a first output port and a second output port of the first optical coupler are amplified by the first semiconductor optical amplifying device and the second semiconductor optical amplifying device to be input to a first input port and a second input port of the second optical coupler, respectively. Third light is output from an output port of the second optical coupler.

13 Claims, 18 Drawing Sheets

(51) Int. Cl.
- H01S 5/00 (2006.01)
- H01S 5/50 (2006.01)
- H01S 5/02 (2006.01)
- H01S 5/227 (2006.01)
- *G02B 6/12* (2006.01)
- *G02B 6/122* (2006.01)
- *H04B 10/61* (2013.01)

(52) U.S. Cl.
CPC .......... H01S 5/5018 (2013.01); *G02B 6/1228* (2013.01); *G02B 2006/121* (2013.01); *G02B 2006/12121* (2013.01); *G02B 2006/12147* (2013.01); *G02B 2006/12159* (2013.01); *H01S 5/021* (2013.01); *H01S 5/227* (2013.01); *H04B 10/6162* (2013.01)

(56) References Cited

U.S. PATENT DOCUMENTS

| | | | |
|---|---|---|---|
| 8,964,284 B2 * | 2/2015 | Ziari | H04J 14/02 |
| | | | 359/344 |
| 2014/0078580 A1 | 3/2014 | Hasegawa | |
| 2017/0244491 A1 * | 8/2017 | Hayashi | H04B 10/5053 |

\* cited by examiner

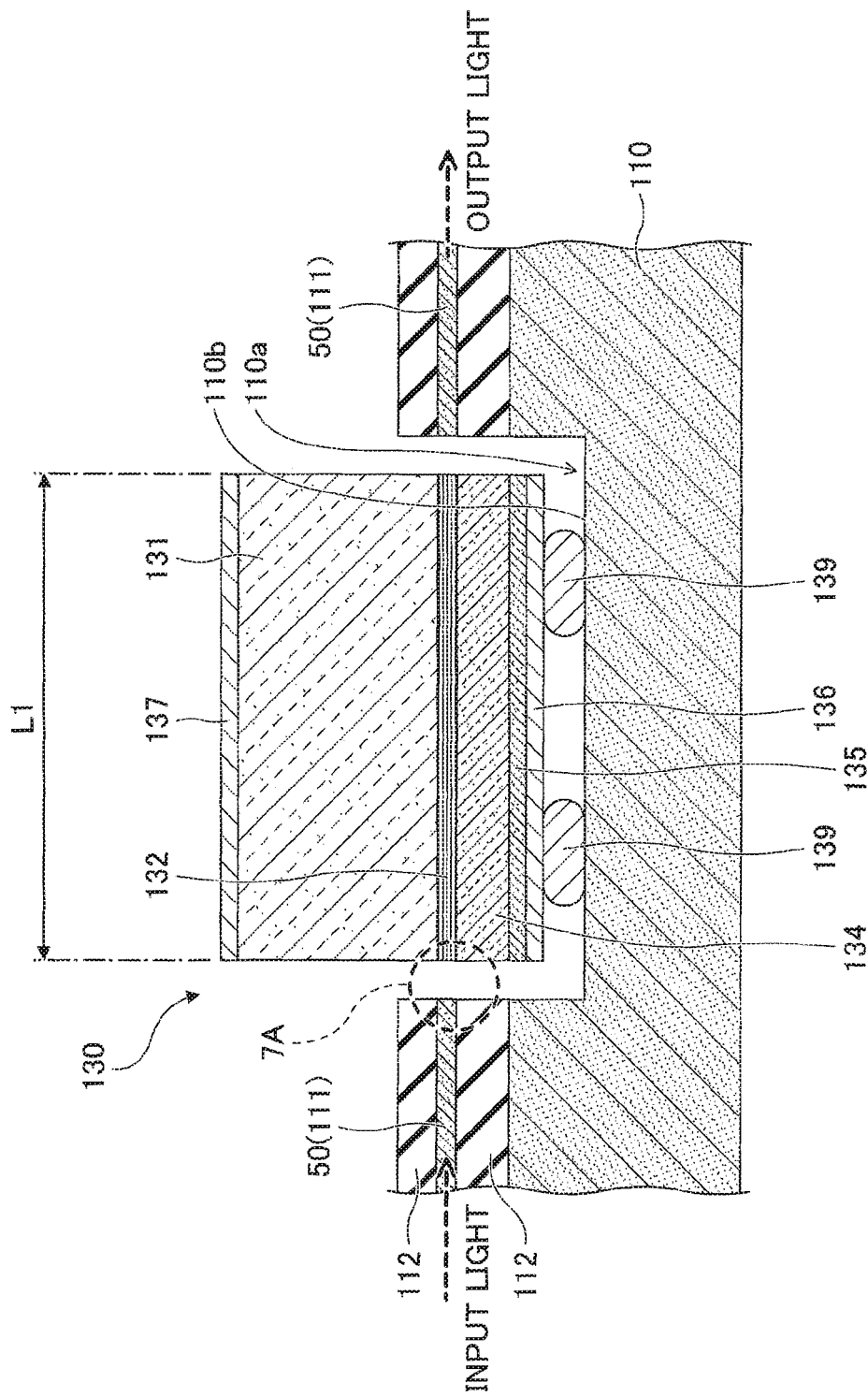

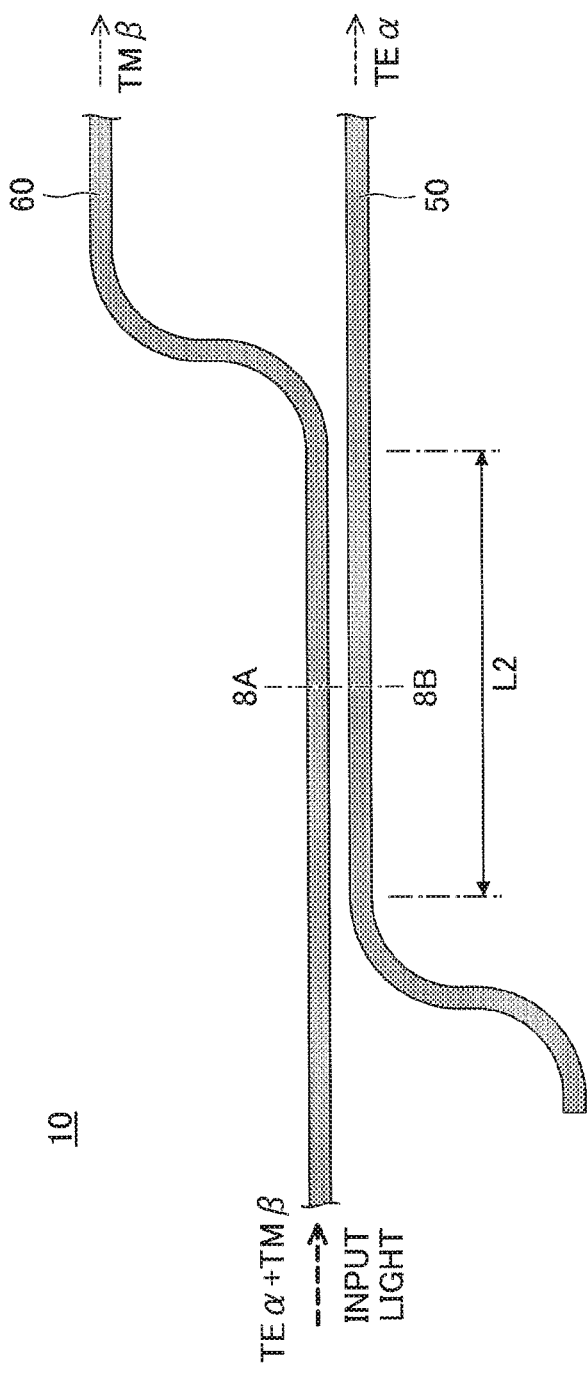

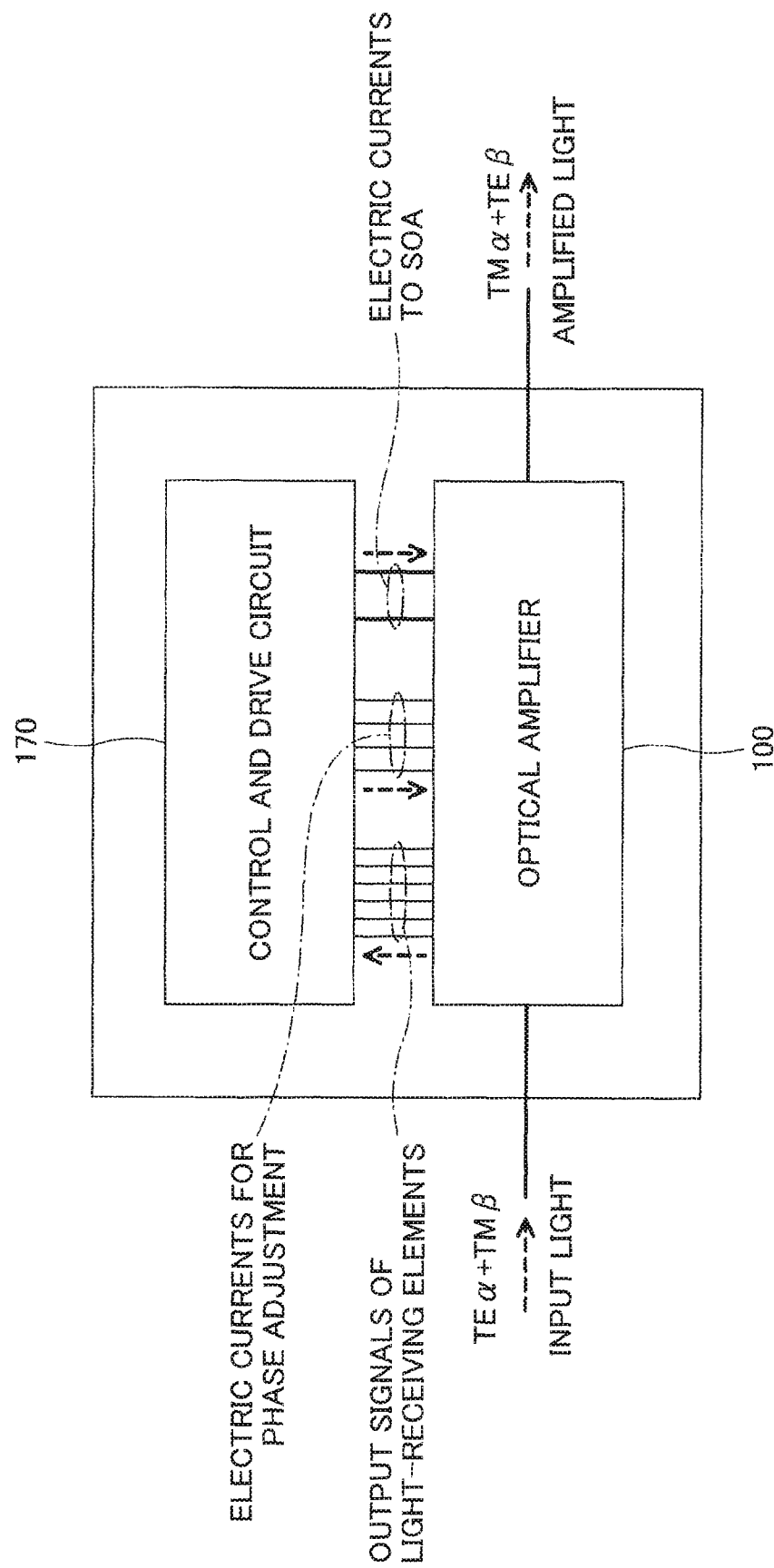

OPTICAL AMPLIFIER AND OPTICAL SWITCH DEVICE

CROSS-REFERENCE TO RELATED APPLICATION

This application is based upon and claims the benefit of priority of the prior Japanese Patent Application No. 2017-153630, filed on Aug. 8, 2017, the entire contents of which are incorporated herein by reference.

FIELD

A certain aspect of the embodiments discussed herein is related to optical amplifiers and optical switch devices

BACKGROUND

Semiconductor optical amplifying devices such as semiconductor optical amplifiers (SOAs) are known as small-size optical amplifiers. According to SOAs, there is a significant difference between the amplification factor for TE polarized waves and the amplification factor for TM polarized waves. Therefore, optical amplifiers employ a polarization diversity circuit. The polarization diversity circuit splits input light into a TE polarized wave and a TM polarized wave, and inputs the TE polarized wave directly to an SOA while converting the TM polarized wave into a TE polarized wave and inputting the TE polarized wave to an SOA. According to optical amplifiers employing a polarization diversity circuit, a TM polarized wave is thus converted into a TE polarized wave and thereafter input to an SOA. Therefore, it is possible to reduce a difference in optical gain due to the direction of polarization.

Reference may be made to Japanese Laid-open Patent Publication No. 2001-7450 for related art.

SUMMARY

According to an aspect of the embodiments, an optical amplifier includes a polarization splitter, a polarization rotator, a first optical coupler that is a 2×2 optical coupler, a first semiconductor optical amplifying device, a second semiconductor optical amplifying device, and a second optical coupler. The TE polarized wave of light split by the polarization splitter is input to a first input port of the first optical coupler. The TM polarized wave of the light split by the polarization splitter is converted into a TE polarized wave by the polarization rotator to be input to a second input port of the first optical coupler. First light output from a first output port of the first optical coupler is amplified by the first semiconductor optical amplifying device to be input to a first input port of the second optical coupler. Second light output from a second output port of the first optical coupler is amplified by the second semiconductor optical amplifying device to be input to a second input port of the second optical coupler. Third light is output from an output port of the second optical coupler.

The object and advantages of the embodiments will be realized and attained by means of the elements and combinations particularly pointed out in the claims.

It is to be understood that both the foregoing general description and the following detailed description are exemplary and explanatory and not restrictive of the invention.

BRIEF DESCRIPTION OF THE DRAWINGS

FIG. 7 is a diagram illustrating the optical amplifier according to the second embodiment;

FIGS. 8A and 8B are diagrams illustrating the optical amplifier according to the second embodiment;

FIG. 10 is a structure diagram of an optical amplification device according to the second embodiment;

DESCRIPTION OF EMBODIMENTS

Figure 1:
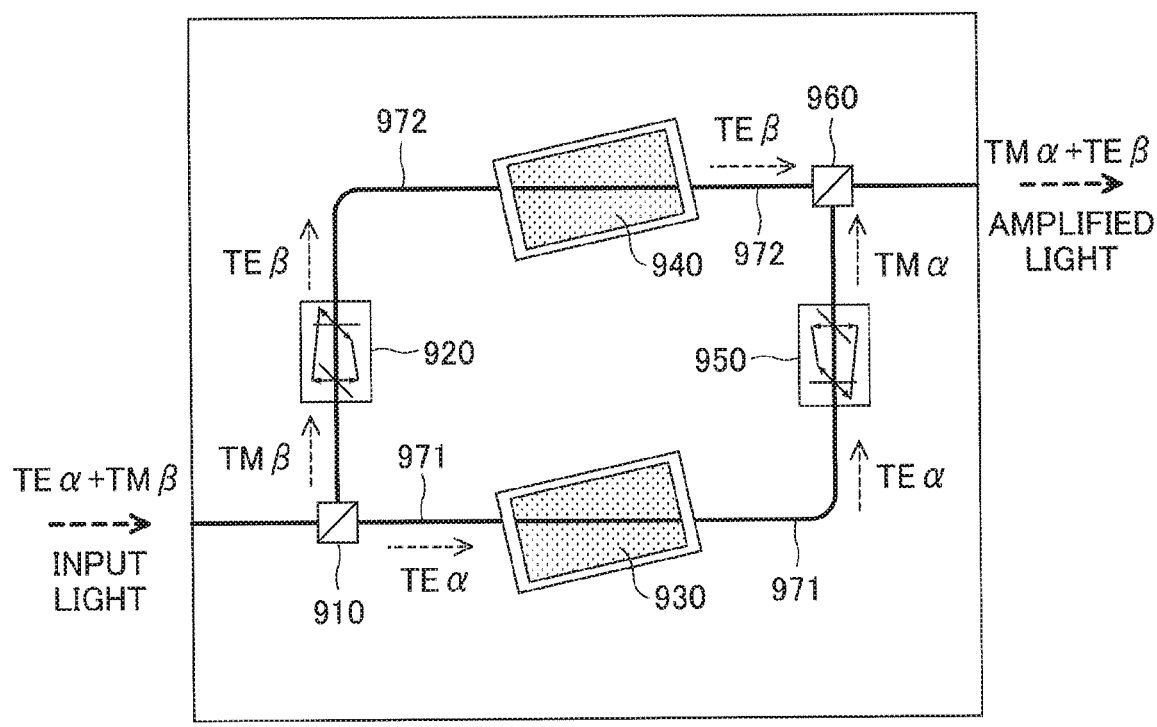
FIG. 1 is a structure diagram of an optical amplifier.

According to the optical amplifiers that employ a polarization diversity circuit as described above, when the input light contains a TE polarization component and a TM polarization component in equal proportions, the TE polarized wave and the TM polarized wave can be amplified at the same amplification factor. If, however, the TE polarization component and the TM polarization component of the input light change at random, so that one of the TE polarization component and the TM polarization component becomes extremely more than the other, the amplification factor for one of the TE polarization component and the TM polarization component may differ from the amplification factor for the other. That is, when the direction of polarization of light input to an optical amplifier changes at random, the intensity of the output light of the optical amplifier also varies, thus causing a signal error. It is possible to equalize the amplification factors by increasing electric current supplied to SOAs. In this case, however, an increase in the electric current supplied to the SOAs causes an increase in power consumption, which is not preferable.

Therefore, there is a demand for an optical amplifier that prevents variations in the intensity of its output light without an increase in power consumption even when the direction of polarization of light input to the optical amplifier changes at random.

According to an aspect, it is possible to prevent variations in the intensity of the output light of an optical amplifier without an increase in power consumption even when the direction of polarization of light input to the optical amplifier changes at random.

Preferred embodiments of the present invention will be explained with reference to accompanying drawings. In the following description, the same members or elements are referred to using the same reference numeral, and the associated description is not repeated. Furthermore, for convenience of description, the layers illustrated in the drawings do not necessarily reflect their accurate thickness.

[a] First Embodiment

First, an optical amplifier employing a polarization diversity circuit is described with reference to FIG. 1. The optical amplifier illustrated in FIG. 1 includes a polarization splitter 910, a first polarization rotator 920, a first SOA 930, a second SOA 940, a second polarization rotator 950, and a polarization combiner 960. Two optical waveguides 971 and 972 are formed between the polarization splitter 910 and the polarization combiner 960. One exit surface of the polarization splitter 910 connects to the first SOA 930, the second polarization rotator 950, and the polarization combiner 960 in this order through the optical waveguide 971. The other exit surface of the polarization splitter 910 connects to the first polarization rotator 920, the second SOA 940, and the polarization combiner 960 in this order through the optical waveguide 972. The first SOA 930 and the second SOA 940 have the function of amplifying TE polarized waves.

Light input to the optical amplifier contains a TE $\alpha$ polarized wave that is a TE polarization component and a TM $\beta$ polarized wave that is a TM polarization component. When light is input to the optical amplifier illustrated in FIG. 1, the input light is split into the TE $\alpha$ polarized wave and the TM $\beta$ polarized wave by the polarization splitter 910. The TE $\alpha$ polarized wave is output to the optical waveguide 971 and the TM $\beta$ polarized wave is output to the optical waveguide 972.

The TE $\alpha$ polarized wave output to the optical waveguide 971 is amplified by the first SOA 930, and is thereafter converted into a TM $\alpha$ polarized wave that is a TM polarization component by the second polarization rotator 950 to be input to one entrance surface of the polarization combiner 960. The TM $\beta$ polarized wave output to the optical waveguide 972 is converted into a TE $\beta$ polarized wave that is a TE polarization component by the first polarization rotator 920 to be amplified by the second SOA 940, and is thereafter input to another entrance surface of the polarization combiner 960. The TM $\alpha$ polarized wave and the TE $\beta$ polarized wave input to the polarization combiner 960 are combined by the polarization combiner 960 to be output as amplified light.

In general, the SOA can achieve linear amplification of constant optical gain when the intensity of input light is relatively low. As the intensity of input light increases, the optical gain gradually decreases, so that the intensity of the output light of the SOA saturates. The intensity of the light output of the SOA at the time when the optical gain thus starts to decrease is referred to as the saturation power of the SOA. Normally, in the case of amplifying an optical signal using an SOA, the density of electric current supplied to the SOA is sufficiently increased to make the saturation power of the SOA sufficiently high relative to the assumed intensity of light input to the SOA, in order that the SOA can achieve liner amplification.

That is, when the light input to the optical amplifier illustrated in FIG. 1 is in a random polarization state, the polarization splitter 910 splits the input light into the TE $\alpha$ polarized wave and the TM $\beta$ polarized wave in random proportions, and in the most extreme case, the input light may all become one polarization component. If the input light thus all becomes one polarization component, it is possible that the output light is not amplified with a desired amplification factor and varies in intensity.

In order for the first SOA 930 and the second SOA 940 to perform amplification in the linear region of optical gain even in such a case, their saturation output has to be increased. To increase the saturation output, the electric current supplied to the first SOA 930 and the second SOA 940 has to be increased. This, however, increases power consumption.

Therefore, there is a demand for an optical amplifier that prevents variations in the intensity of its output light without an increase in power consumption even when the direction of polarization of light input to the optical amplifier changes at random.

Figure 2:
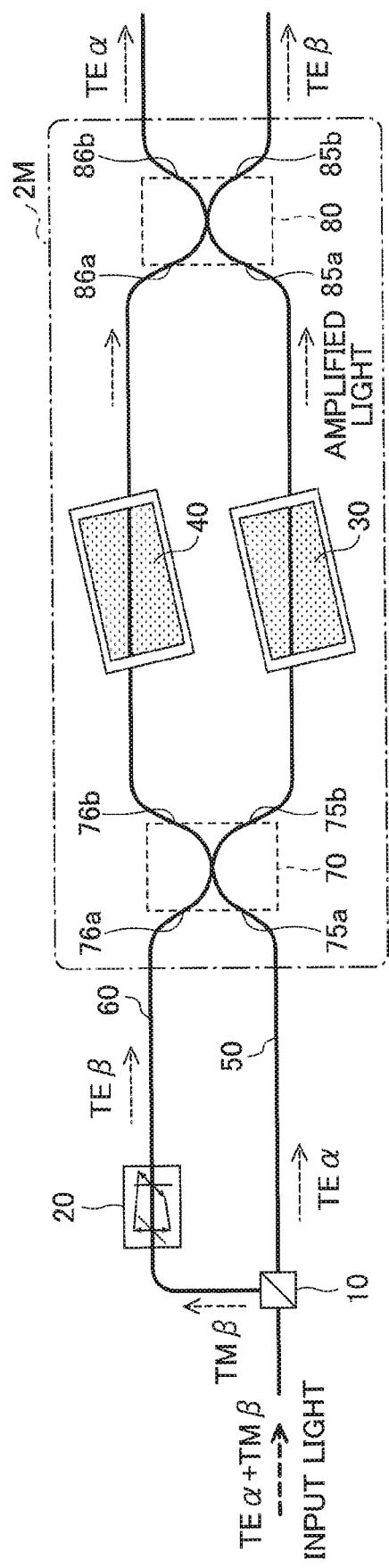
FIG. 2 is a structure diagram of an optical amplifier according to a first embodiment.

Next, an optical amplifier according to a first embodiment is described with reference to FIG. 2. The optical amplifier according to this embodiment includes a polarization splitter 10, a polarization rotator 20, a first SOA 30, and a second SOA 40. One output of the polarization splitter 10 is input to a first optical waveguide 50, and the other output of the polarization splitter 10 is input to a second optical waveguide 60 through the polarization rotator 20. The first optical waveguide 50 and the second optical waveguide 60 connect to a first input port 75a and a second input port 76a, respectively, of a 2×2 first optical coupler 70. A first output port 75b and a second output port 76b of the first optical coupler 70 connect to the first SOA 30 and the second SOA 40, respectively.

A 2×2 second optical coupler 80 is formed in the stage subsequent to the first SOA 30 and the second SOA 40. Accordingly, an area indicated by the one-dot chain line in FIG. 2 forms a Mach-Zehnder interferometer 2M. The first SOA 30 and the second SOA 40 has the function of amplifying TE polarized waves, and light input to the optical amplifier contains a TE $\alpha$ polarized wave that is a TE polarization component and a TM $\beta$ polarized wave that is a TM polarization component.

According to embodiments of the present invention, in the first optical coupler 70, the input of the first optical waveguide 50 is referred to as the first input port 75a, and the input of the second optical waveguide 60 is referred to as the second input port 76a. Furthermore, one of the optical waveguides exiting from the first optical coupler 70 is referred to as the first output port 75b, and the other of the optical waveguides exiting from the first optical coupler 70 is referred to as the second output port 76b.

In addition, in the second optical coupler 80, one of the optical waveguides entering the second optical coupler 80 is referred to as a first input port 85a, and the other of the optical waveguides entering the second optical coupler 80 is referred to as a second input port 86a. Furthermore, one of the optical waveguides exiting from the second optical coupler 80 is referred to as a first output port 85b, and the other of the optical waveguides exiting from the second optical coupler 80 is referred to as a second output port 86b.

When light is input to the optical amplifier of this embodiment, the input light is split into the TE $\alpha$ polarized wave and the TM $\beta$ polarized wave by the polarization splitter 10. The TE $\alpha$ polarized wave is output to the first optical waveguide 50, and the TM $\beta$ polarized wave is output to the second optical waveguide 60 through the polarization rotator 20.

The TM $\beta$ polarized wave output from the polarization splitter 10 is converted into a TE $\beta$ polarized wave by the polarization rotator 20, and is thereafter input to the first optical coupler 70 together with the TE $\alpha$ polarized wave output to the first optical waveguide 50. The first optical coupler 70 is a 2×2 optical coupler, and the phase difference of input light of the first optical coupler 70 is 0 or $\pi$. Each of the two input light components is divided into halves.

Thus, according to the first optical coupler 70, the intensity of light exiting from the first output port 75b can be equalized with the intensity of light exiting from the second output port 76b. The light output from the first output port 75b of the first optical coupler 70, into which the TE α polarized wave and the TE β polarized wave are combined, is amplified by the first SOA 30 and thereafter input to the first input port 85a of the second optical coupler 80. Furthermore, the light output from the second output port 76b of the first optical coupler 70, into which the TE α polarized wave and the TE β polarized wave are combined, is amplified by the second SOA 40 and thereafter input to the second input port 86a of the second optical coupler 80. The second optical coupler 80, which is a 2×2 optical coupler, is configured so that the phase difference between light input from the first input port 85a and light input from the second input port 86a is 0. As a result, the second optical coupler 80 outputs light of the TE β polarized wave from the first output port 85b and light of the TE α polarized wave from the second output port 86b.

According to this embodiment, even when there is a difference in intensity between the TE polarization component and the TM polarization component of input light, light input to the first SOA 30 and light input to the second SOA 40 can be equal in intensity. Accordingly, it is possible to equalize light input to the first SOA 30 and light input to the second SOA 40 in intensity independent of the polarization state of the input light, and light of half the intensity of the input light is input to each of the first SOA 30 and the second SOA 40. Therefore, compared with the optical amplifier illustrated in FIG. 1, it is possible to perform amplification in the linear region of optical gain even when the saturation power is lowered, for example, approximately halved. Accordingly, compared with the optical amplifier illustrated in FIG. 1, it is possible to reduce electric current supplied to the first SOA 30 and the second SOA 40, so that it is possible to reduce power consumption.

The above description is given of the case of using a 2×2 optical coupler as the second optical coupler 80. In the case of using a 2×1 optical coupler as the second optical coupler 80, the second optical coupler 80 outputs light into which the TE α polarized wave and the TE β polarized wave are combined.

The polarization splitter 10 and the polarization rotator 20 may be replaced with a single polarization splitter-rotator having the functions of both a polarization splitter and a polarization rotator.

[b] Second Embodiment

Figure 3:
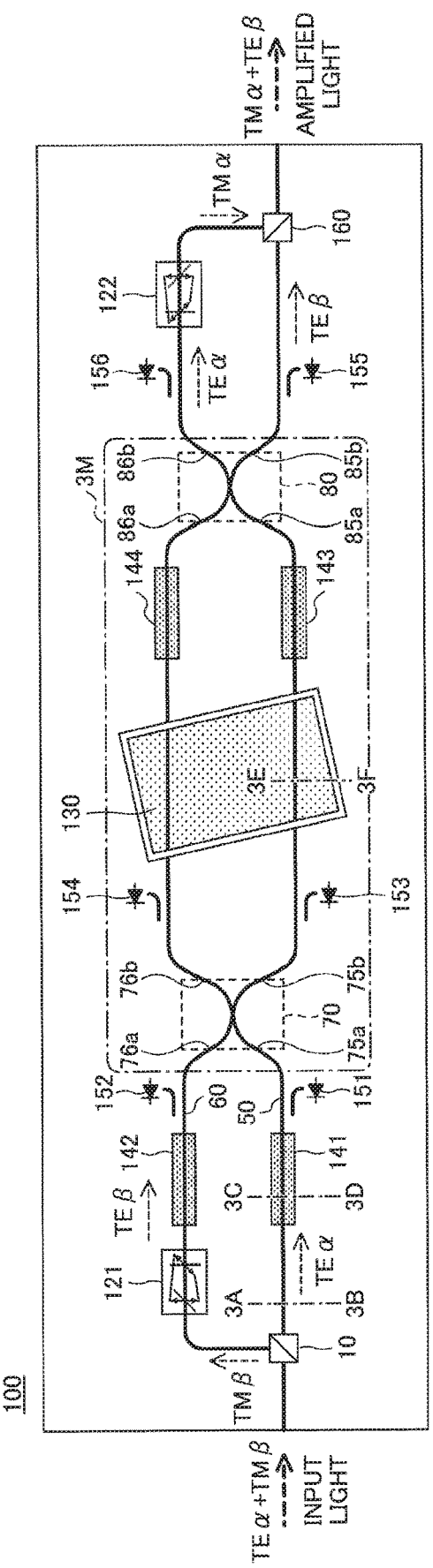
FIG. 3 is a structure diagram of an optical amplifier according to a second embodiment.

Next, an optical amplifier according to a second embodiment is described with reference to FIG. 3. The optical amplifier according to this embodiment includes phase shifters for phase adjustment and light-receiving elements (light-detecting devices) for monitoring. Referring to FIG. 3, an optical amplifier 100 according to this embodiment includes the polarization splitter 10, a first polarization rotator 121, a second polarization rotator 122, an SOA array 130, and a polarization combiner 160. The optical amplifier 100 further includes a first phase shifter 141, a second phase shifter 142, a third phase shifter 143, and a fourth phase shifter 144. The optical amplifier 100 also includes a first light-receiving element 151, a second light-receiving element 152, a third light-receiving element 153, a fourth light-receiving element 154, a fifth light-receiving element 155, and a sixth light-receiving element 156. The SOA array 130 has a monolithic structure into which the first SOA 30 and the second SOA 40 of the first embodiment are integrated.

According to this embodiment, one output of the polarization splitter 10 is input to the first optical waveguide 50, and the other output of the polarization splitter 10 is input to the second optical waveguide 60 through the first polarization rotator 121. The first optical waveguide 50 and the second optical waveguide 60 connect to the first input port 75a and the second input port 76a, respectively, of the 2×2 first optical coupler 70. The first output port 75b of the first optical coupler 70 connects to one of the optical waveguides of the SOA array 130 to be input to the first input port 85a of the second optical coupler 80. The second output port 76b of the first optical coupler 70 connects to the other of the optical waveguides of the SOA array 130 to be input to the second input port 86a of the second optical coupler 80.

The first optical coupler 70 is formed in the stage preceding the SOA array 130. The second optical coupler 80 is formed in the stage subsequent to the SOA array 130. Accordingly, an area indicated by the one-dot chain line in FIG. 3 forms a Mach-Zehnder interferometer 3M. The SOA array 130 has the function of amplifying TE polarized waves, and light input to the optical amplifier 100 contains a TE α polarized wave that is a TE polarization component and a TM β polarized wave that is a TM polarization component.

The first phase shifter 141 is provided for the first optical waveguide 50 between the polarization splitter 10 and the first optical coupler 70. The first light-receiving element 151 is provided near the first optical waveguide 50 between the first phase shifter 141 and the first optical coupler 70. The second phase shifter 142 is provided for the second optical waveguide 60 between the first polarization rotator 121 and the first optical coupler 70. The second light-receiving element 152 is provided near the second optical waveguide 60 between the second phase shifter 142 and the first optical coupler 70.

The third light-receiving element 153 is provided near an optical waveguide between the first optical coupler 70 and the SOA array 130. The fourth light-receiving element 154 is provided near an optical waveguide between the first optical coupler 70 and the SOA array 130.

The third phase shifter 143 is provided for an optical waveguide between the SOA array 130 and the second optical coupler 80. The fourth phase shifter 144 is provided for an optical waveguide between the SOA array 130 and the second optical coupler 80.

The fifth light-receiving element 155 is provided near an optical waveguide between the second optical coupler 80 and the polarization combiner 160. The sixth light-receiving element 156 is provided near an optical waveguide between the second optical coupler 80 and the second polarization rotator 122.

When light is input to the optical amplifier 100 of this embodiment, the input light is split into the TE α polarized wave and the TM β polarized wave by the polarization splitter 10. The TE α polarized wave is output to the first optical waveguide 50, and the TM β polarized wave is output to the second optical waveguide 60.

The TE α polarized wave output from the polarization splitter 10 to the first optical waveguide 50 passes through the first phase shifter 141 and is thereafter input to the first input port 75a of the first optical coupler 70. The TM β polarized wave output from the polarization splitter 10 to the second optical waveguide 60 is converted into a TE β polarized wave by the first polarization rotator 121 to pass through the second phase shifter 142, and is thereafter input to the second input port 76a of the first optical coupler 70. The first optical coupler 70, which is a 2×2 optical coupler, can divide each of the two input light components into halves by causing the phase difference of light input to the first optical coupler 70 to be 0 or π.

Light exiting from the first output port 75b of the first optical coupler 70 passes through one of the optical waveguides of the SOA array 130 and the third phase shifter 143 and is thereafter input to the first input port 85a of the second optical coupler 80. Likewise, light exiting from the second output port 76b of the first optical coupler 70 passes through the other of the optical waveguides of the SOA array 130 and the fourth phase shifter 144 and is thereafter input to the second input port 86a of the second optical coupler 80.

The second optical coupler 80, which is a 2×2 optical coupler, is set to the cross state by causing the phase difference of light input to the second optical coupler 80 to be 0. Accordingly, the two input light components are output, being split into the TE α polarized wave component and the TE β polarized wave component in the state before entry into the first optical coupler 70. Therefore, the TE α polarized wave component is output to the second output port 86b of the second optical coupler 80, and the TE β polarized wave component is output to the first output port 85b of the second optical coupler 80.

Thereafter, light of the TE α polarized wave component output to the second output port 86b is converted into a TMα polarized wave by the second polarization rotator 122, and is thereafter combined with light of the TE β polarized wave component output to the first output port 85b by the polarization combiner 160 to be output as amplified light.

Next, a method of adjusting an optical amplifier according to this embodiment is described. According to this embodiment, to adjust the optical amplifier 100, the first phase shifter 141, the second phase shifter 142, the third phase shifter 143, and the fourth phase shifter 144 are provided. Furthermore, the first light-receiving element 151, the second light-receiving element 152, the third light-receiving element 153, the fourth light-receiving element 154, the fifth light-receiving element 155, and the sixth light-receiving element 156 are provided to monitor the intensity of light propagating through optical waveguides.

In order for two optical waveguides serving as the two arms of the Mach-Zehnder interferometer 3M to be equal in light intensity, the phase difference between two propagating lights input to the first optical coupler 70 on the input side of the Mach-Zehnder interferometer 3M has to be 0 or π. Accordingly, when the phase difference between the polarized waves of light input to the optical amplifier 100 is sufficiently small, the optical paths from the input of the optical amplifier 100 to the first optical coupler 70 may be made equal in length to cause the phase difference to be 0 or π.

Depending on the condition of the transmission path of light prior to the input of the optical amplifier 100, however, light input to the optical amplifier 100 may have a phase difference between the two polarization components. Therefore, according to this embodiment, the first phase shifter 141 and the second phase shifter 142 are provided for the two arms preceding the first optical coupler 70 to make it possible to adjust the phase of the two light polarization components input to the Mach-Zehnder interferometer 3M. In this case, the adjustment is performed while monitoring the intensity of light in two optical waveguides serving as the two arms of the Mach-Zehnder interferometer 3M. Therefore, the third light-receiving element 153 and the fourth light-receiving element 154 are provided in the stage preceding the SOA array 130.

Furthermore, according to this embodiment, the third phase shifter 143 and the fourth phase shifter 144 are provided for the two arms subsequent to the SOA array 130. In addition, the first light-receiving element 151 and the second light-receiving element 152 are provided in the stage preceding the first optical coupler 70 on the input side of the Mach-Zehnder interferometer 3M, and the fifth light-receiving element 155 and the sixth light-receiving element 156 are provided in the stage subsequent to the second optical coupler 80 on the output side of the Mach-Zehnder interferometer 3M.

The third phase shifter 143 and the fourth phase shifter 144 perform adjustment to eliminate the phase difference between lights propagating through the two arms of the Mach-Zehnder interferometer 3M so that the Mach-Zehnder interferometer 3M is the cross state. According to this embodiment, the two arms are formed in a symmetric structure in the Mach-Zehnder interferometer 3M. Therefore, the two arms are supposed to be equal in optical path length, so that lights propagating through the two arms are supposed to be equal in phase. Actually, however, because of a manufacturing error, the two arms may differ slightly in optical path length to shift the Mach-Zehnder interferometer 3M from the cross state.

Therefore, according to this embodiment, the intensity of the two lights input to the Mach-Zehnder interferometer 3M are measured with the first light-receiving element 151 and the second light-receiving element 152, and the intensity of the two lights output from the Mach-Zehnder interferometer 3M are measured with the fifth light-receiving element 155 and the sixth light-receiving element 156. Based on the light intensities thus measured, adjustment is performed to equalize the ratio of the intensity detected with the second light-receiving element 152 to the intensity detected with the first light-receiving element 151 with the ratio of the intensity detected with the fifth light-receiving element 155 to the intensity detected with the sixth light-receiving element 156. Specifically, the phases of propagating lights are adjusted with the third phase shifter 143 and the fourth phase shifter 144 so that the Mach-Zehnder interferometer 3M is adjusted to be in the cross state.

Moreover, according to this embodiment, the polarization combiner 160 is provided in the stage subsequent to the second optical coupler 80 on the output side of the Mach-Zehnder interferometer 3M, and the second polarization rotator 122 is provided between the second output port 86b of the second optical coupler 80 and the polarization combiner 160. This is for returning one of the two obtained amplified TE polarization component lights to a TM polarized wave and for causing the two polarization components to return to polarization-multiplexed light to be output from the optical amplifier 100.

Figure 4:
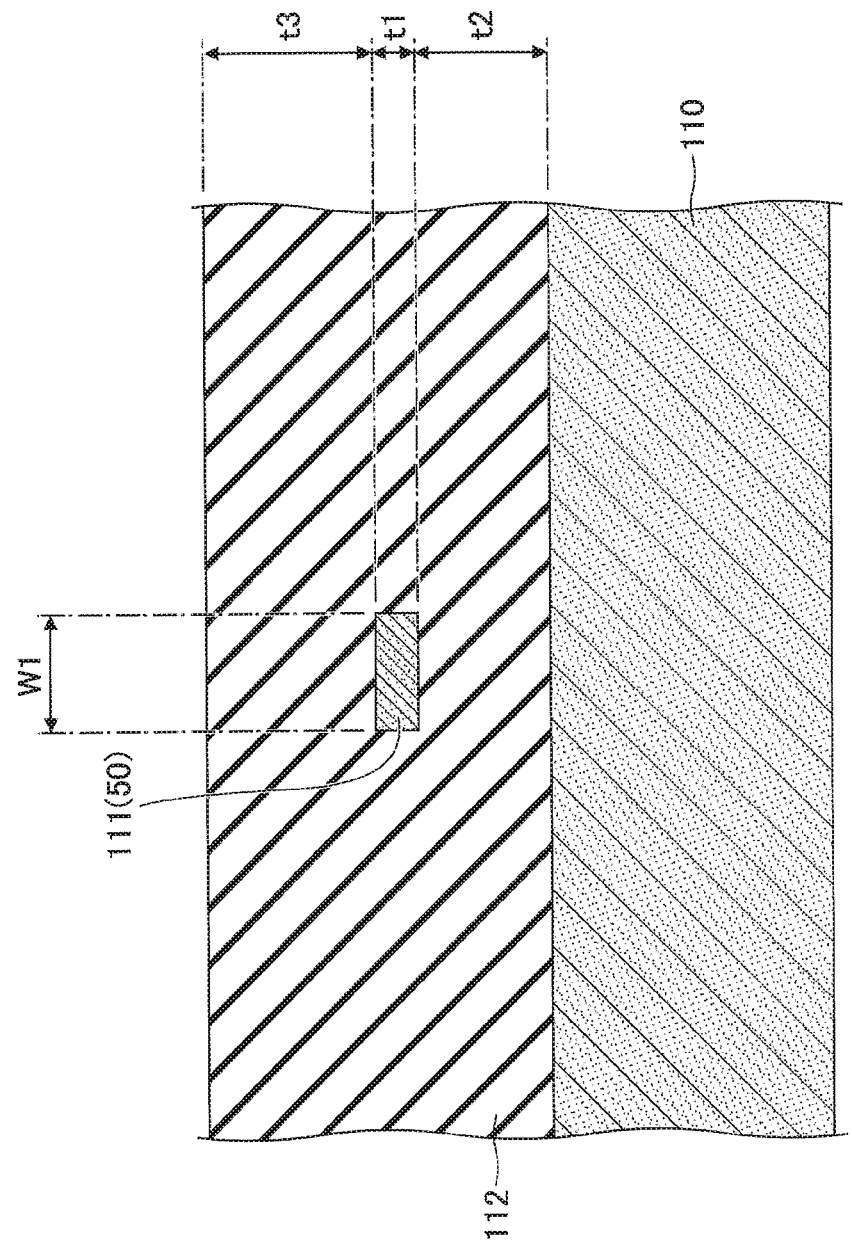
FIG. 4 is a diagram illustrating the optical amplifier according to the second embodiment.

Next, the details of the optical amplifier 100 of this embodiment are described in more detail. FIG. 4 is a cross-sectional view of the first optical waveguide 50, taken along the one-dot chain line 3A-3B of FIG. 3. The optical amplifier 100 according to this embodiment is formed on a silicon (Si) substrate 110. The first optical waveguide 50 in which light propagates is formed of a Si core 111, and the core 111 is surrounded and covered by a cladding 112 formed of silicon oxide. A cross section of the core 111 perpendicular to a direction in which light propagates ("the light propagating direction") has a width W1 of approximately 0.5 μm and a thickness t1 of approximately 220 nm. The core 111 is formed on part of the cladding 112 having a thickness t2 of approximately 2 μm on the Si substrate 110. The cladding 112 is also formed on the lateral and upper sides of the core 111. Part of the cladding 112 on the core 111 has a thickness t3 of approximately 3 µm. The same is the case with the second optical waveguide 60.

Figure 5:
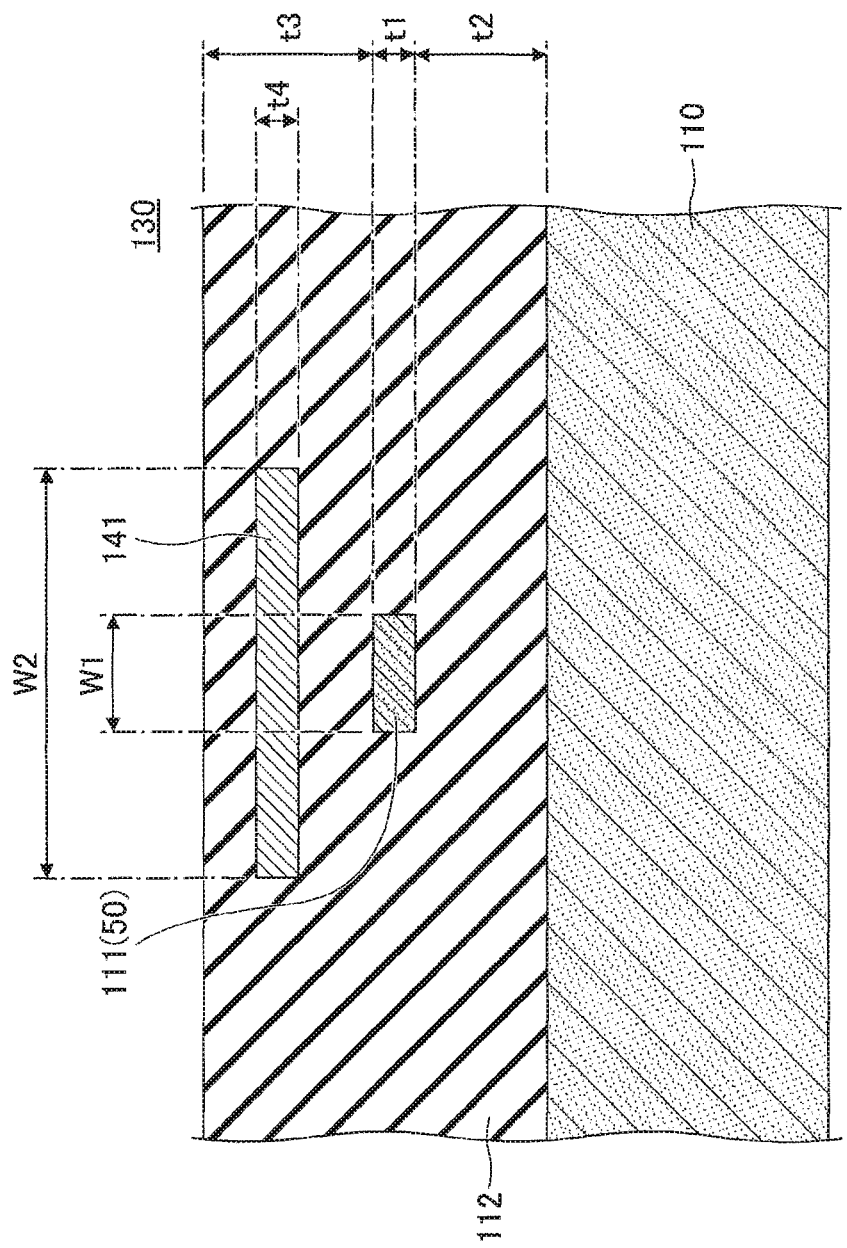
FIG. 5 is a diagram illustrating the optical amplifier according to the second embodiment.

Next, phase shifters according to this embodiment are described. FIG. 5 is a cross-sectional view of the first phase shifter 141, taken along the one-dot chain line 3C-3D of FIG. 3. The first phase shifter 141 is formed of a material such as titanium (Ti) or titanium nitride (TiN) over the first optical waveguide 50. A cross section of the first phase shifter 141 perpendicular to the light propagating direction has a width W2 of approximately 3 µm and has a thickness t4 of approximately 200 nm. The material forming the first phase shifter 141, such as Ti or TiN, generates heat when an electric current flows through the material. Therefore, the first phase shifter 141 serves as a heater. Therefore, by changing the refractive index of, for example, the core 111 by causing an electric current to flow through the first phase shifter 141 to change the temperature of, for example, the core 111, it is possible to adjust the phase of light propagating through the core 111. The same is the case with the second phase shifter 142, the third phase shifter 143, and the fourth phase shifter 144.

Figure 6:
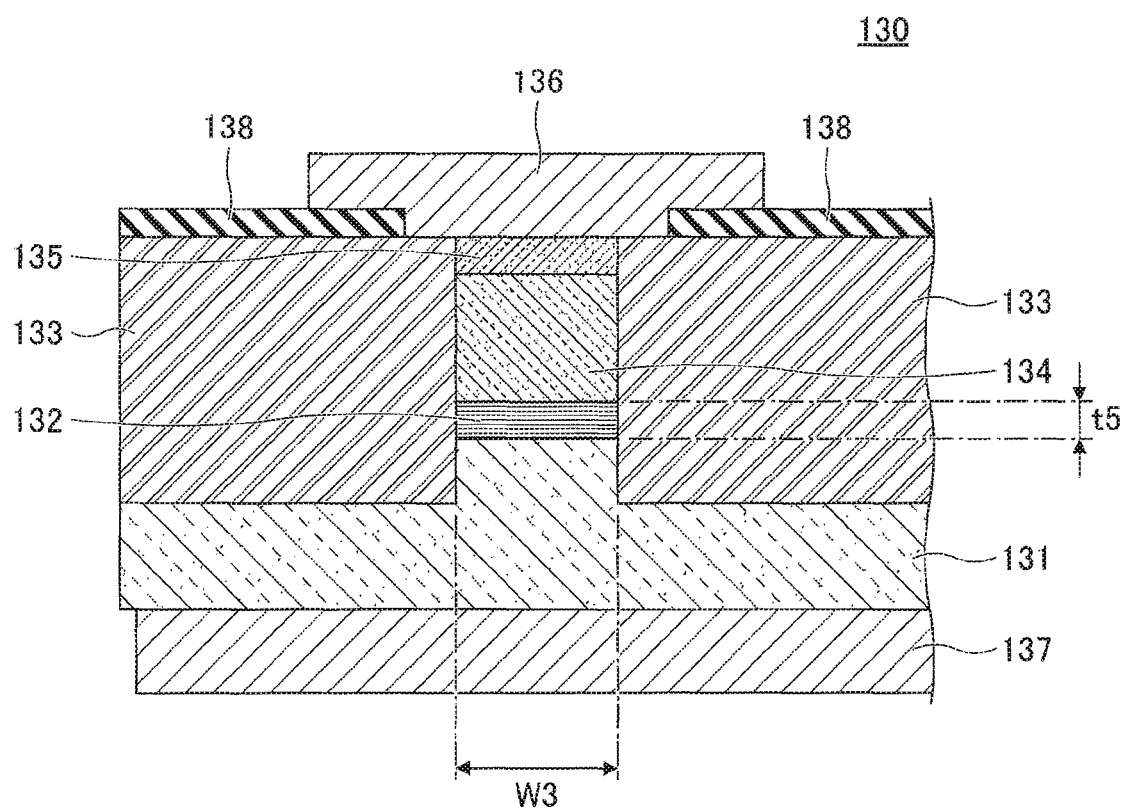
FIG. 6 is a diagram illustrating the optical amplifier according to the second embodiment.

Next, an SOA according to this embodiment is described. FIG. 6 is a cross-sectional view of one of the optical waveguides of the SOA array 130, taken along the one-dot chain line 3E-3F of FIG. 3.

The SOA array 130 includes an n-InP substrate 131. A core serving as the one of the optical waveguides is formed of a multiple quantum well (MQW) active layer 132 on a first surface of the n-InP substrate 131. Specifically, the MQW active layer 132 is formed of MQWs that are alternate layers of indium phosphide (InP) and indium gallium arsenide phosphide (InGaAsP). The MQW active layer 132 has gain in the 1.55 µm wavelength band. A cross section of the MQW active layer 132, which is striped, has a width W3 of approximately 1.5 µm and a thickness t5 of approximately 300 nm. A buried layer 133 formed of semi-insulating InP (SI-InP) is provided (buried) on each side of the MQW active layer 132. A p-InP layer 134 and a contact layer 135 formed of, for example, p-InGaAsP are stacked on the MQW active layer 132. According to this embodiment, the n-InP substrate 131 and the p-InP layer 134 serve as claddings. A P electrode 136 is formed on the contact layer 135, and an N electrode 137 is formed on a second surface of the n-InP substrate 131 opposite to the first surface. A passivation film 138 of, for example, silicon oxide is formed on the buried layer 133 so that the P electrode 136 contacts only the contact layer 135 as much as possible.

As illustrated in FIG. 7, the SOA array 130 as described above is attached to the Si substrate 110, being turned upside down from the position illustrated in FIG. 6 with the n-InP substrate 131 positioned on the upper side. FIG. 7 is a sectional view of the SOA array 130, taken along one of the optical waveguides of the SOA array 130. Specifically, a recess 110a is formed in a region of the Si substrate 110 where the SOA array 130 is attached. The SOA array 130 is attached to a surface 110b of the Si substrate 110 at the bottom of the recess 110a with the N electrode 137 facing upward and the P electrode 136 facing downward. Gold-tin bumps 139 are provided on the surface 110b of the Si substrate 110. The P electrode 136 of the SOA array 130 is connected to the bumps 139 by flip-chip bonding.

In general, the n-InP substrate 131 varies in thickness, while the thicknesses of the p-InP layer 134, the contact layer 135, and the P electrode 136 can be controlled relatively precisely. Therefore, according to this embodiment, the SOA array 130 is attached to the surface 110b of the Si substrate 110 at the bottom of the recess 110a with the n-InP substrate 131 positioned on the upper side. This makes it easy to align the vertical position of the MQW active layer 132 serving as an optical waveguide of the SOA array 130 with the vertical position of the first optical waveguide 50 in a part 7A indicated by the dashed line. The SOA array 130 has a length L1 of, for example, approximately 600 µm. In order to reduce unnecessary reflection, the SOA array 130 is formed so that the optical waveguides are inclined, for example, approximately 7° relative to the direction of a normal to the end faces of the SOA array 130. This makes it possible for the SOA array 130 to stably operate. Furthermore, an anti-reflective (AR) coating is formed on each of the end faces of the SOA array 130 at which the optical waveguides are formed.

FIGS. 6 and 7 illustrate one of the optical waveguides of the SOA array 130. The other of the optical waveguides has the same structure as illustrated. The first SOA 30 and the second SOA 40 of the first embodiment have substantially the same structure as illustrated.

Figure 8B:
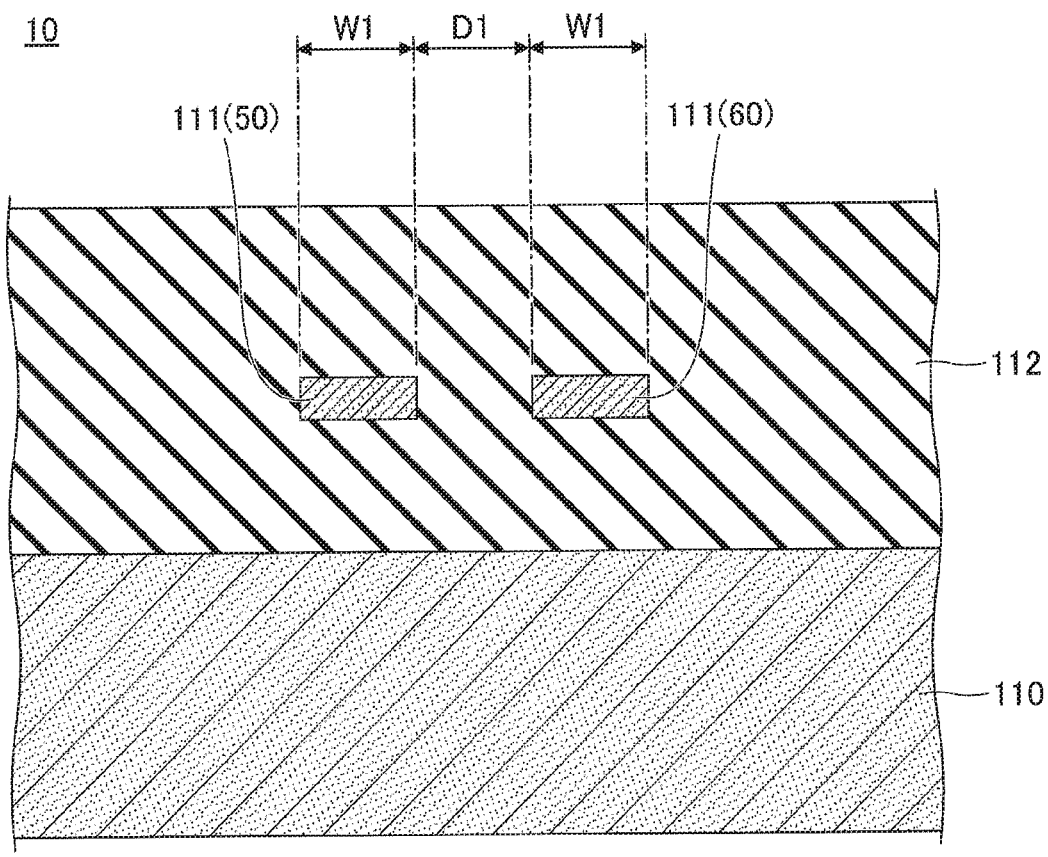

Next, a polarization splitter and a polarization combiner according to this embodiment are illustrated. FIG. 8A is a plan view of the polarization splitter 10. FIG. 8B is a cross-sectional view of the polarization splitter 10, taken along the one-dot chain line 8A-8B of FIG. 8A. The polarization splitter 10 includes two optical waveguides each having the width W1 of 0.5 µm. The first optical waveguide 50 and the second optical waveguide 60 (the cores 111) serving as the two optical waveguides are arranged at an interval D1 of approximately 0.35 µm and each have a length L2 of approximately 4 µm. By thus arranging two optical waveguides, namely, the first optical waveguide 50 and the second optical waveguide 60, close to each other, it is possible to form a directional coupler. The polarization combiner 160 has the same structure.

Figure 9A:
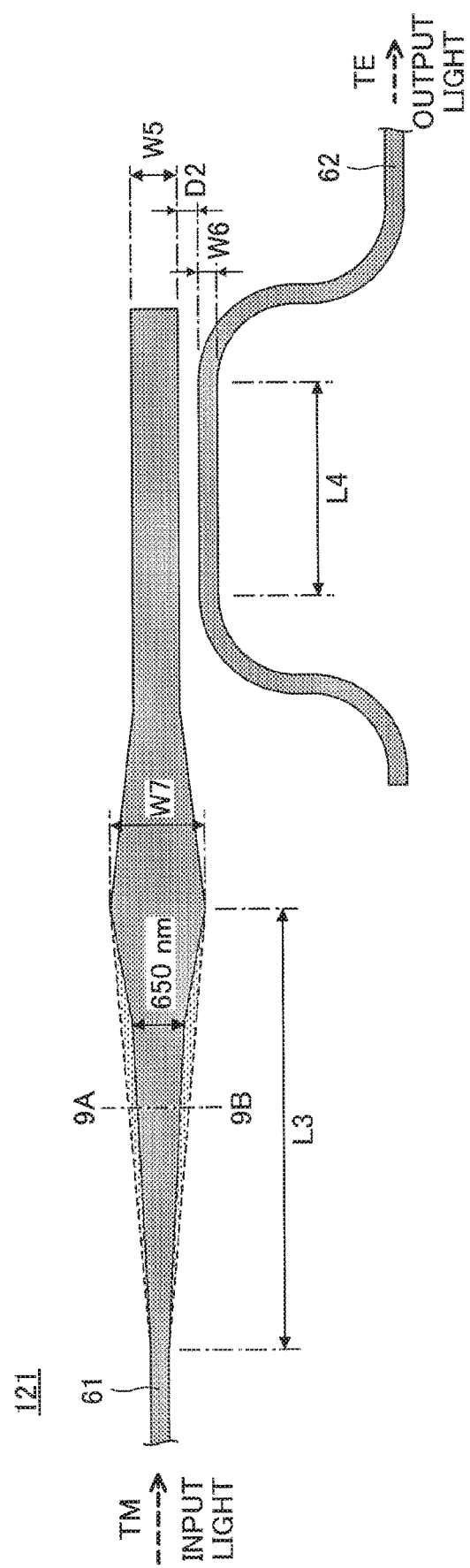
FIGS. 9A and 9B are diagrams illustrating the optical amplifier according to the second embodiment.
Figure 9B:
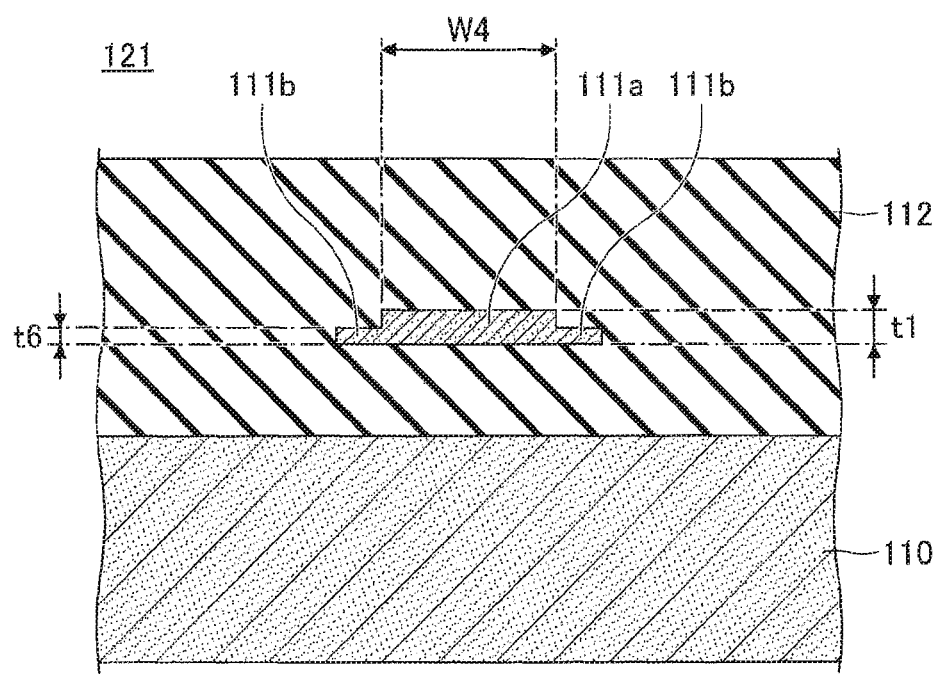

Next, polarization rotators according to this embodiment are described. FIG. 9A is a plan view of the first polarization rotator 121. FIG. 9B is a cross-sectional view of the first polarization rotator 121, taken along the one-dot chain line 9A-9B of FIG. 9A. The first polarization rotator 121 changes the width of an optical waveguide 61 to convert TM-mode light input to the optical waveguide 61 into higher-order TE-mode light, and thereafter extracts the light as dominant TE-mode light with a subsequent directional coupler to output the light from an optical waveguide 62. In a front-stage region of the first polarization rotator 121 where a length L3 of the optical waveguide 61 is approximately 100 µm, a width W4 of a core 111a of the optical waveguide 61 gradually increases from 0.5 µm to 1.4 µm. Furthermore, slabs 111b having a thickness t6 of 95 nm are formed one on each side of the core 111a. Furthermore, in the rear stage of the first polarization rotator 121, an optical waveguide 62 is provided close to the optical waveguide 61. In a region where the optical waveguide 61 and the optical waveguide 62 are close to each other, the optical waveguide 61 and the optical waveguide 62 are provided at an interval D2 of approximately 120 nm and each have a length L4 of approximately 50 µm. Furthermore, in this region, the optical waveguide 61 has a width 5 of 1.25 µm and the optical waveguide 62 has a width 6 of 0.61 µm. According to the first polarization rotator 121 as described above, when TM polarized wave light is input to the optical waveguide 61, TE polarized wave light is output from the optical waveguide 62. The same is the case with the second polarization rotator 122.

Next, light-receiving elements according to this embodiment are described. The first light-receiving element 151, the second light-receiving element 152, the third light-receiving element 153, the fourth light-receiving element 154, the fifth light-receiving element 155, and the sixth light-receiving element 156 are formed of germanium (Ge). The first light-receiving element 151, the third light-receiving element 153, and the fifth light-receiving element 155 are placed close to the first optical waveguide 50, and can monitor the intensity of light propagating through corresponding regions of the first optical waveguide 50. The second light-receiving element 152, the fourth light-receiving element 154, and the sixth light-receiving element 156 are placed close to the second optical waveguide 60, and can monitor the intensity of light propagating through corresponding regions of the second optical waveguide 60.

The polarization splitter 10 and the first polarization rotator 121 may be replaced with a single polarization splitter-rotator having the functions of both a polarization splitter and a polarization rotator. The second polarization rotator 122 and the polarization combiner 160 may be replaced with a single polarization splitter-rotator having the functions of both a polarization splitter and a polarization rotator.

Next, an optical amplification device according to this embodiment is described. Referring to FIG. 10, the optical amplification device of this embodiment includes the optical amplifier 100 of this embodiment and a control and drive circuit 170 connected to the optical amplifier 100. The control and drive circuit 170 supplies the optical amplifier 100 with electric currents to flow through the SOA array 130 and electric currents for phase adjustment in the first phase shifter 141, the second phase shifter 142, the third phase shifter 143, and the fourth phase shifter 144. Furthermore, the optical amplifier 100 inputs the output signals of the first light-receiving element 151, the second light-receiving element 152, the third light-receiving element 153, the fourth light-receiving element 154, the fifth light-receiving element 155, and the sixth light-receiving element 156 serving as monitors to the control and drive circuit 170.

In other respects than those described above, the second embodiment may be the same as the third embodiment.

[c] Third Embodiment

Figure 11:
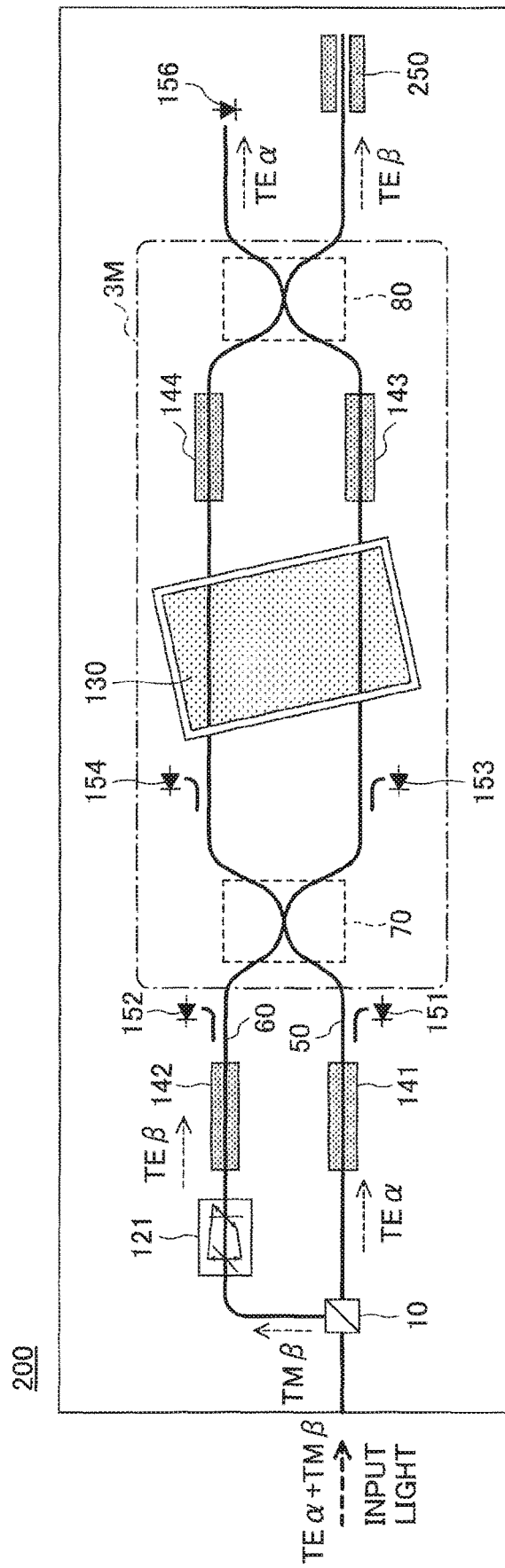
FIG. 11 is a structure diagram of an optical amplifier according to a third embodiment.

Next, an optical amplifier according to a third embodiment is described with reference to FIG. 11. Referring to FIG. 11, an optical amplifier 200 according to this embodiment is different from the optical amplifier 100 of the second embodiment in that the second polarization rotator 122 and the polarization combiner 160 are removed and that a light-receiving element 250 that is a high-speed light-receiving element is provided in place of the fifth light-receiving element 155.

According to this embodiment, the third phase shifter 143 and the fourth phase shifter 144 are adjusted to reduce the light intensity detected at the sixth light-receiving element 156 to 0. As a result, lights of two polarization components can be detected at the light-receiving element 250.

Figure 12A:
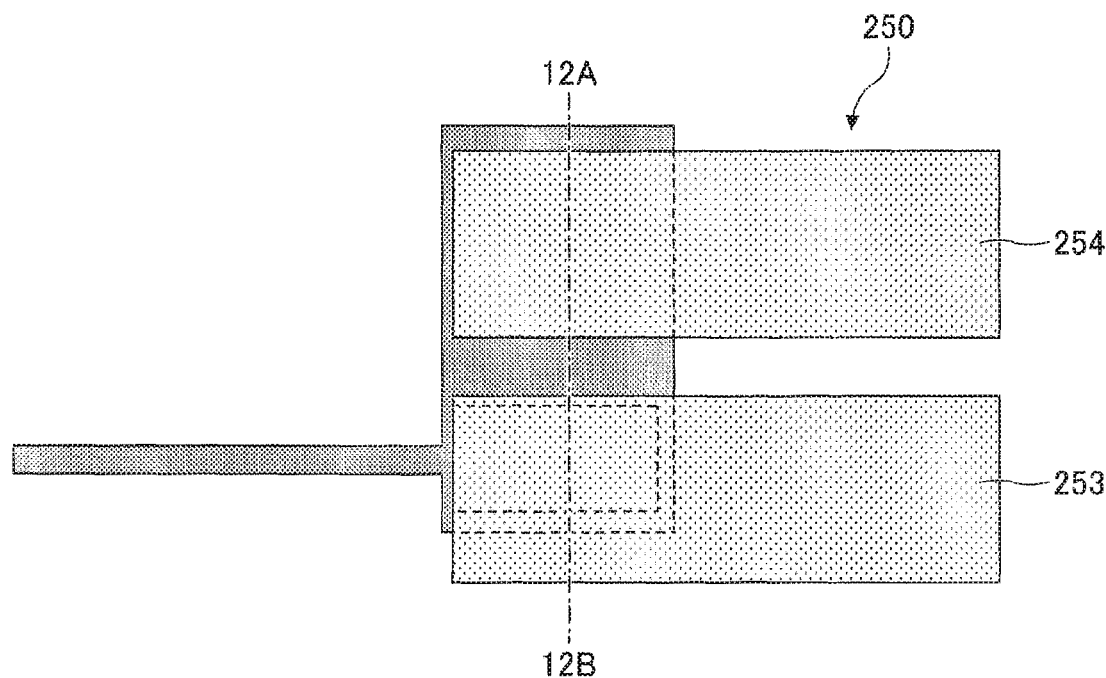
FIGS. 12A and 12B are diagrams illustrating the optical amplifier according to the third embodiment.
Figure 12B:
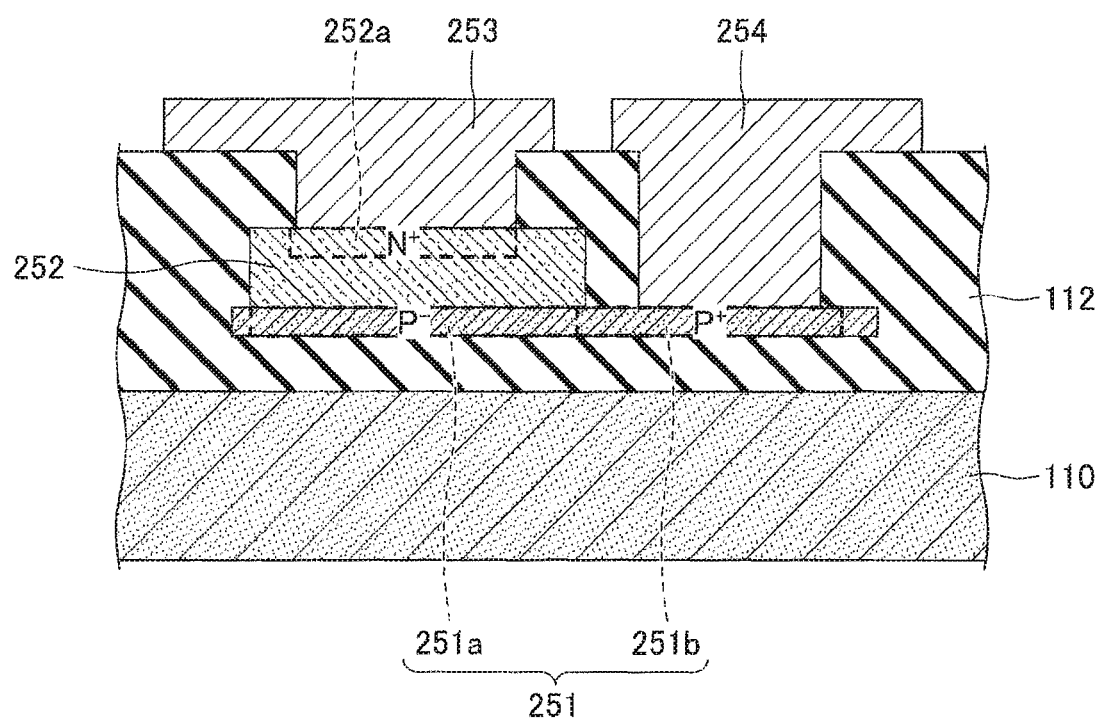

The high-speed light-receiving element forming the light-receiving element 250 is described with reference to FIGS. 12A and 12B. FIG. 12A is a plan view of the light-receiving element 250. FIG. 12B is a cross-sectional view of the light-receiving element 250, taken along the one-dot chain line 12A-12B of FIG. 12A. The light-receiving element 250 is connected to an end of one of the output ports of the second optical coupler 80, and includes a Si layer 251 and a Ge light-receiving layer 252 connected to an end of the second optical coupler 80. The Si layer 251 includes a P⁻ region 251a and a P⁺ region 251b. The Ge light-receiving layer 252 is formed on the P⁻ region 251a of the Si layer 251.

An N⁺ region 252a is formed in an upper part of the Ge light-receiving layer 252. A first electrode 253 is formed on the N⁺ region 252a. A second electrode 254 is formed on the P⁺ region 251b of the Si layer 251. The first electrode 253 and the second electrode 254 are formed of aluminum. When light enters the Ge light-receiving layer 252, an optical signal is detected.

Figure 13:
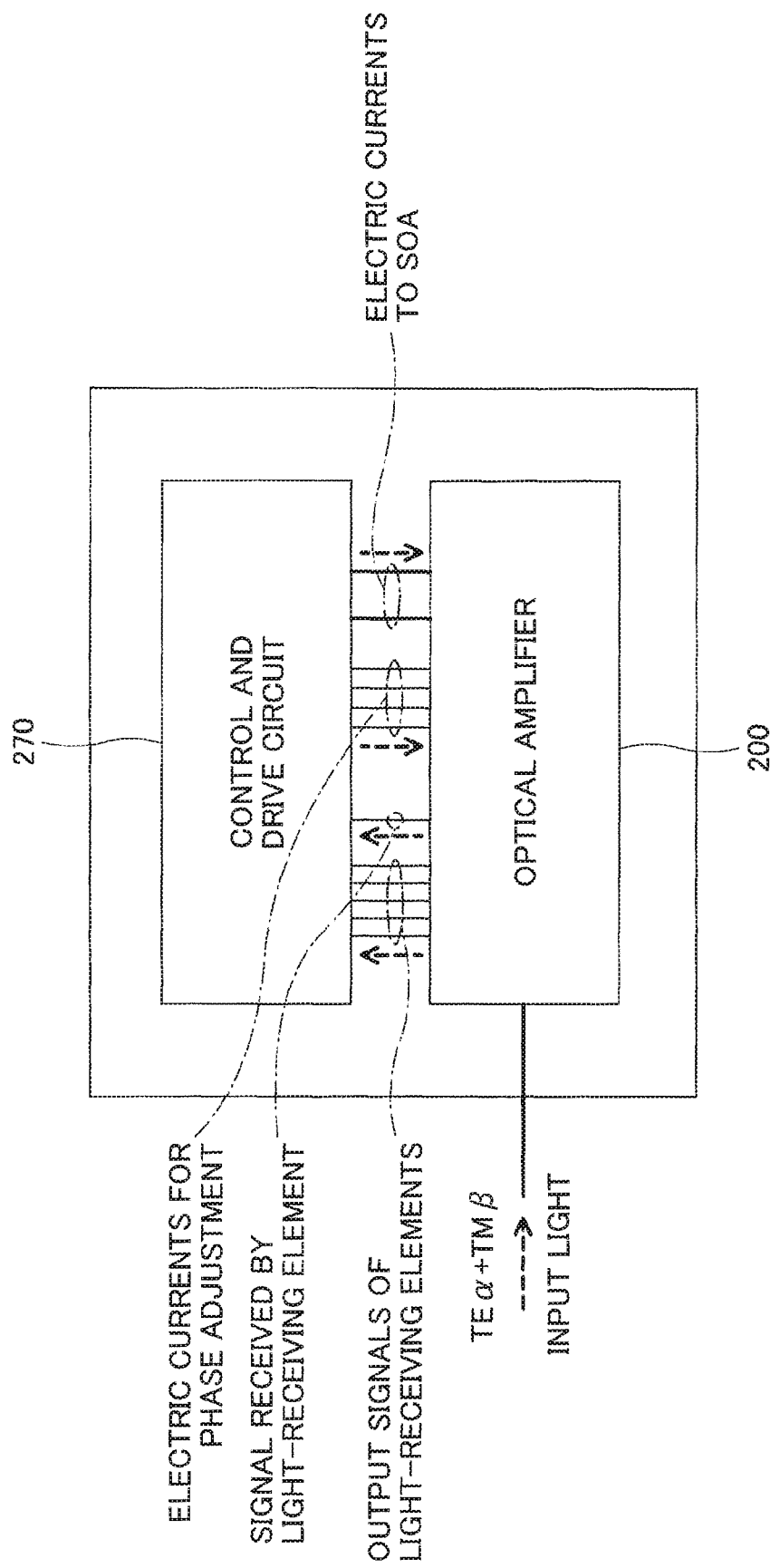
FIG. 13 is a structure diagram of an optical receiver according to the third embodiment.

Next, an optical receiver according to this embodiment is described. Referring to FIG. 13, the optical receiver according to this embodiment includes the optical amplifier 200 of this embodiment and a control and drive circuit 270 connected to the optical amplifier 200. The control and drive circuit 270 supplies the optical amplifier 200 with electric currents to flow through the SOA array 130 and electric currents for phase adjustment in the first phase shifter 141, the second phase shifter 142, the third phase shifter 143, and the fourth phase shifter 144. Furthermore, the optical amplifier 200 transmits the output signals of the first light-receiving element 151, the second light-receiving element 152, the third light-receiving element 153, the fourth light-receiving element 154, and the sixth light-receiving element 156 serving as monitors and a signal received by the light-receiving element 250 to the control and drive circuit 270.

In other respects than those described above, the third embodiment may be the same as the second embodiment.

[d] Fourth Embodiment

Figure 14:
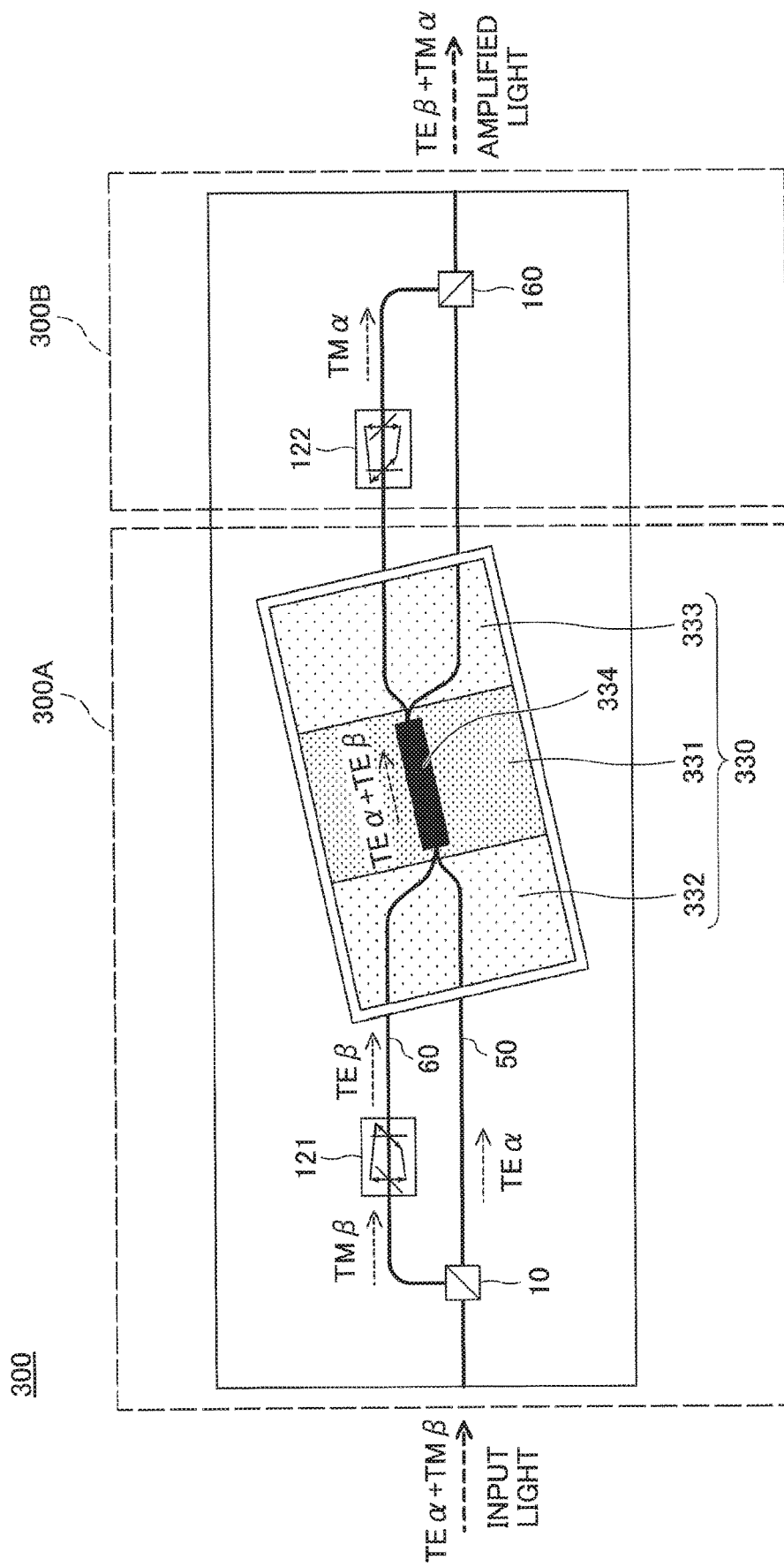
FIG. 14 is a structure diagram of an optical amplifier according to a fourth embodiment.

Next, an optical amplifier according to a fourth embodiment is described with reference to FIG. 14. Referring to FIG. 14, an optical amplifier 300 according to this embodiment employs a coupler SOA 330 in which the two optical waveguides of the SOA array 130 of the second embodiment are brought so close to each other as to couple propagating lights to share an active region. According to the optical amplifier 300 of this embodiment, a single active region is determined in an SOA region 331 of the coupler SOA 330, so that the total input power to the active region is constant whatever polarized wave the input light is.

The coupler SOA 330 includes the SOA region 331, a semiconductor optical waveguide region 332 preceding the SOA region 331, and a semiconductor optical waveguide region 333 subsequent to the SOA region 331. The coupler SOA 330 includes a multimode interference coupler, a directional coupler, two input ports, and two output ports. According to the coupler SOA 330, coupling is adjusted to cross two optical paths connecting the input ports and the output ports, so that it is possible to amplify propagating light.

According to the coupler SOA 330, light input to the two input ports of the preceding semiconductor optical waveguide region 332 is amplified in the SOA region 331 and output from the two output ports of the subsequent semiconductor optical waveguide region 333. According to this embodiment, by performing amplification in a single active region 334 in the SOA region 331, it is possible to perform optical amplification independent of the polarized waves of light input to the optical amplifier 300.

In other respects than those described above, the fourth embodiment may be the same as the first or second embodiment. According to this embodiment, however, because there is a single active region, the total input power to the active region is constant irrespective of input polarized waves, so that there is no need for phase adjustment as performed in the first or second embodiment.

[e] Fifth Embodiment

Next, a fifth embodiment is described. This embodiment is directed to a polarization-independent optical switch device. Referring to FIG. 14, the optical amplifier 300 of the fourth embodiment includes a front-stage part 300A and a rear-stage part 300B. According to the optical switch device of this embodiment, an optical switch is provided between the front-stage part 300A and the rear-stage part 300B.

The optical switch device of this embodiment is described with reference to FIG. 15. The optical switch device of this embodiment includes a front-stage part 301A and a rear-stage part 301B of a first optical amplifier, a front-stage part 302A and a rear-stage part 302B of a second optical amplifier, a first optical switch 410, and a second optical switch 420. The first optical amplifier including the front-stage part 301A and the rear-stage part 301B and the second optical amplifier including the front-stage part 302A and the rear-stage part 302B are the same as the optical amplifier 300 including the front-stage part 300A and the rear-stage part 300B according to the fourth embodiment.

Figure 15:
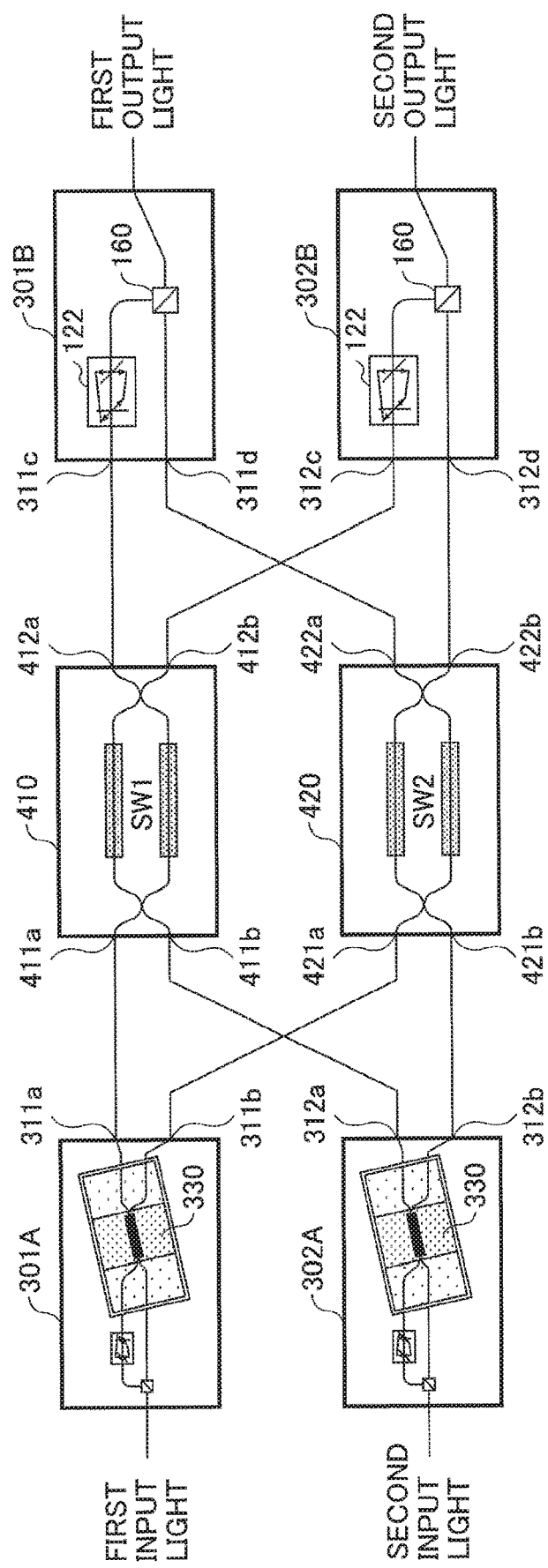
FIG. 15 is a structure diagram of an optical switch device according to a fifth embodiment.

Referring to FIG. 15, according to the optical switch device, a first output 311a of the front-stage part 301A of the first optical amplifier is connected to a first input 411a of the first optical switch 410, and a second output 311b of the front-stage part 301A is connected to a first input 421a of the second optical switch 420. Furthermore, a first output 312a of the front-stage part 302A of the second optical amplifier is connected to a second input 411b of the first optical switch 410, and a second output 312b of the front-stage part 302A is connected to a second input 421b of the second optical switch 420.

Furthermore, a first output 412a of the first optical switch 410 is connected to a first input 311c of the rear-stage part 301B of the first optical amplifier, and a second output 412b of the first optical switch 410 is connected to a first input 312c of the rear-stage part 302B of the second optical amplifier. Furthermore, a first output 422a of the second optical switch 420 is connected to a second input 311d of the rear-stage part 301B of the first optical amplifier, and a second output 422b of the second optical switch 420 is connected to a second input 312d of the rear-stage part 302B of the second optical amplifier.

The first optical switch 410 and the second optical switch 420 operate with respect to TE polarized waves.

First light input to the front-stage part 301A of the first optical amplifier is subjected to polarization splitting and optical amplification in the front-stage part 301A of the first optical amplifier, and is thereafter output to be input to the first input 411a of the first optical switch 410 and the first input 421a of the second optical switch 420. Furthermore, second light input to the front-stage part 302A of the second optical amplifier is subjected to polarization splitting and optical amplification in the front-stage part 302A of the first optical amplifier, and is thereafter output to be input to the second input 411b of the first optical switch 410 and the second input 421b of the second optical switch 420.

When the first optical switch 410 and the second optical switch 420 are set in the cross state, the output light of the first output 412a of the first optical switch 410 and the output light of the first output 422a of the second optical switch 420, which are components of the second input light, are subjected to polarization multiplexing in the rear-stage part 301B of the first optical amplifier and thereafter output as first output light. Furthermore, the output light of the second output 412b of the first optical switch 410 and the output light of the second output 422b of the second optical switch 420, which are components of the first input light, are subjected to polarization multiplexing in the rear-stage part 302B of the second optical amplifier and thereafter output as second output light. Thus, cross-state paths are set with respect to input light of any polarized wave. Likewise, when the first optical switch 410 and the second optical switch 420 are set in the bar state, bar-state paths are set with respect to input light of any polarized wave.

Figure 16:
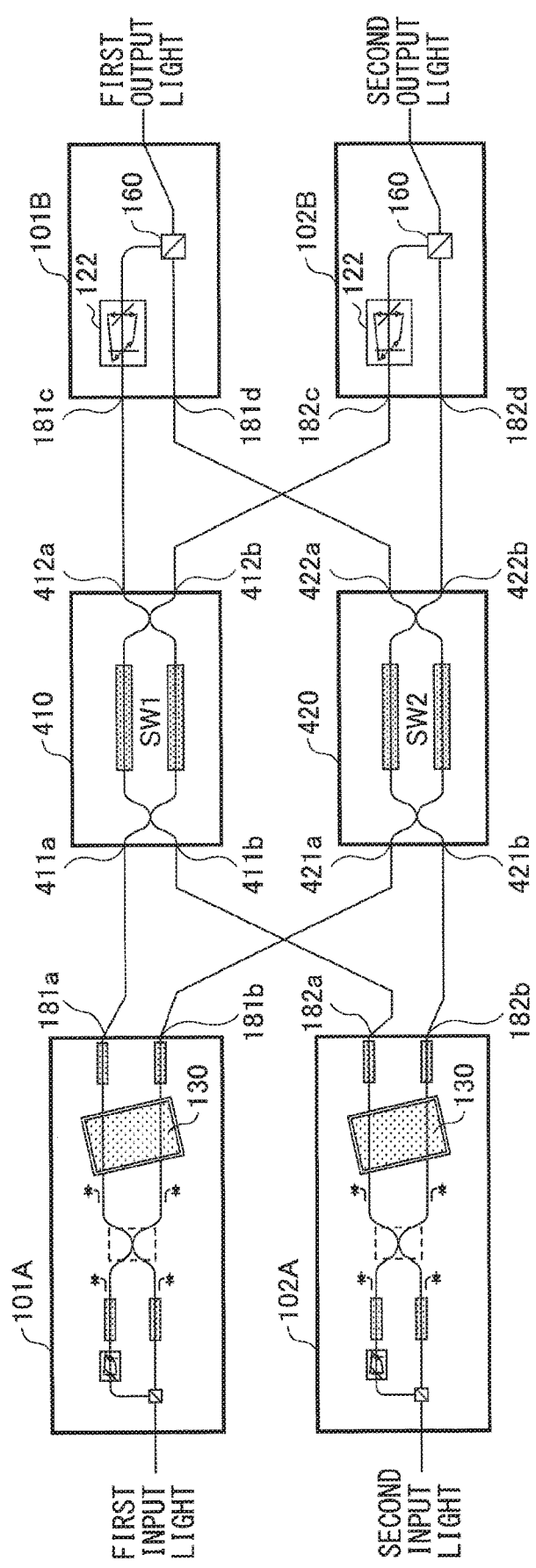
FIG. 16 is a structure diagram of another optical switch device according to the fifth embodiment.

The optical switch device of this embodiment may use an optical amplifier according to the second embodiment as illustrated in FIG. 16. Specifically, this optical switch device includes a front-stage part 101A and a rear-stage part 101B of a first optical amplifier, a front-stage part 102A and a rear-stage part 102B of a second optical amplifier, the first optical switch 410, and the second optical switch 420. The first optical amplifier including the front-stage part 101A and the rear-stage part 101B and the second optical amplifier including the front-stage part 102A and the rear-stage part 102B are the same as the optical amplifier 100 according to the second embodiment.

Referring to FIG. 16, according to the optical switch device, a first output 181a of the front-stage part 101A of the first optical amplifier is connected to the first input 411a of the first optical switch 410, and a second output 181b of the front-stage part 101A is connected to the first input 421a of the second optical switch 420. Furthermore, a first output 182a of the front-stage part 102A of the second optical amplifier is connected to the second input 411b of the first optical switch 410, and a second output 182b of the front-stage part 102A is connected to the second input 421b of the second optical switch 420.

Furthermore, the first output 412a of the first optical switch 410 is connected to a first input 181c of the rear-stage part 101B of the first optical amplifier, and the second output 412b of the first optical switch 410 is connected to a first input 182c of the rear-stage part 102B of the second optical amplifier. Furthermore, the first output 422a of the second optical switch 420 is connected to a second input 181d of the rear-stage part 101B of the first optical amplifier, and the second output 422b of the second optical switch 420 is connected to a second input 182d of the rear-stage part 102B of the second optical amplifier.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. An optical amplifier comprising:
a polarization splitter;
a polarization rotator;
a first optical coupler that is a 2×2 optical coupler;
a first semiconductor optical amplifying device;
a second semiconductor optical amplifying device; and
a second optical coupler,
wherein a TE polarized wave of light split by the polarization splitter is input to a first input port of the first optical coupler,
wherein a TM polarized wave of the light split by the polarization splitter is converted into a TE polarized wave by the polarization rotator to be input to a second input port of the first optical coupler,
wherein first light output from a first output port of the first optical coupler is amplified by the first semiconductor optical amplifying device to be input to a first input port of the second optical coupler, wherein second light output from a second output port of the first optical coupler is amplified by the second semiconductor optical amplifying device to be input to a second input port of the second optical coupler, and third light is output from an output port of the second optical coupler.

2. The optical amplifier as claimed in claim 1, wherein the second optical coupler is a 2×2 optical coupler.

3. The optical amplifier as claimed in claim 2, further comprising:

an additional polarization rotator; and a polarization combiner, wherein light output from a first output port of the second optical coupler is converted into a TM polarized wave by the additional polarization rotator to be combined with light output from a second output port of the second optical coupler by the polarization combiner.

4. The optical amplifier as claimed in claim 1, further comprising:

a phase shifter configured to change a phase of propagating light, the phase shifter being provided between the polarization splitter and the first input port of the first optical coupler or between the polarization rotator and the second input port of the first optical coupler.

5. The optical amplifier as claimed in claim 1, further comprising:

a phase shifter configured to change a phase of propagating light, the phase shifter being provided between the first semiconductor optical amplifying device and the first input port of the second optical coupler or between the second semiconductor optical amplifying device and the second input port of the second optical coupler.

6. The optical amplifier as claimed in claim 1, further comprising:

a first light-detecting device and a second light-detecting device that are configured to measure intensity of propagating light, the first light-detecting device being provided between the first output port of the first optical coupler and the first semiconductor optical amplifying device, the second light-detecting device being provided between the second output port of the first optical coupler and the second semiconductor optical amplifying device.

7. The optical amplifier as claimed in claim 1, further comprising:

a first light-detecting device and a second light-detecting device that are configured to measure intensity of propagating light, the first light-detecting device being provided near the first input port of the first optical coupler, the second light-detecting device being provided near the second input port of the first optical coupler.

8. The optical amplifier as claimed in claim 1, further comprising:

a first light-detecting device and a second light-detecting device that are configured to measure intensity of propagating light, the first light-detecting device being provided near a first output port of the second optical coupler, the second light-detecting device being provided near a second output port of the second optical coupler.

9. The optical amplifier as claimed in claim 1, wherein the first semiconductor optical amplifying device and the second semiconductor optical amplifying device are monolithically integrated onto a same substrate.

10. The optical amplifier as claimed in claim 1, wherein the first semiconductor optical amplifying device, the second semiconductor optical amplifying device, the first optical coupler, and the second optical coupler are combined together into a coupler semiconductor optical amplifier.

11. An optical switch device comprising:

the optical amplifier as set forth in claim 3; and an optical switch provided between the first semiconductor optical amplifying device or the second semiconductor optical amplifying device and the polarization combiner.

12. An optical switch device comprising:

the optical amplifier as set forth in claim 10;

a polarization combiner subsequent to the coupler semiconductor optical amplifier; and an optical switch provided between the coupler semiconductor optical amplifier and the polarization combiner.

13. An optical receiver comprising:

the optical amplifier as set forth in claim 1.

* * * * *